United States Patent [19]

Nishijima

[11] Patent Number: 5,151,667
[45] Date of Patent: Sep. 29, 1992

[54] TEMPERATURE COMPENSATED OSCILLATION CIRCUIT

[75] Inventor: Kazunori Nishijima, Tokyo, Japan

[73] Assignee: NEC Corporation, Tokyo, Japan

[21] Appl. No.: 701,912

[22] Filed: May 17, 1991

[30] Foreign Application Priority Data

May 17, 1990 [JP] Japan ................................. 2-128055

[51] Int. Cl.$^5$ ........................ H03B 5/04; H03B 5/12; H03L 1/02
[52] U.S. Cl. ................................ 331/117 R; 331/176
[58] Field of Search ........ 331/116 R, 116 FE, 117 R, 331/117 FE, 117 D, 176

[56] References Cited

U.S. PATENT DOCUMENTS

| | | | |
|---|---|---|---|
| 4,063,193 | 12/1977 | Wilcox | 331/176 X |
| 4,270,102 | 5/1981 | Gawler et al. | 331/176 X |
| 4,833,426 | 5/1989 | Robichon et al. | 331/176 X |
| 4,884,042 | 11/1989 | Menon et al. | 331/176 X |
| 4,978,930 | 12/1990 | Suter | 331/176 |

FOREIGN PATENT DOCUMENTS 0092005 5/1986 Japan ................................ 331/176

*Primary Examiner*—David Mis
*Attorney, Agent, or Firm*—Sughrue, Mion, Zinn, Macpeak & Seas

[57] ABSTRACT

An oscillation circuit has a differential amplifier including a constant current source formed by a resistor and a transistor whose emitter is grounded through the resistor, and a feedback circuit through which an output of the differential amplifier is positively fed back to an input of the same differential amplifier. The oscillation circuit further includes a band-gap regulator for producing a band-gap voltage proportional to a thermal voltage of transistors forming the band-gap regulator whose emitter areas are different with each other, and an operational amplifier for DC-amplifying the band-gap voltage and applying the amplified band-gap voltage to the base of the transistor forming the constant current source. The oscillation circuit is capable of performing a stable oscillation against a wide range of temperature changes.

5 Claims, 4 Drawing Sheets

TEMPERATURE COMPENSATED OSCILLATION CIRCUIT

BACKGROUND OF THE INVENTION

The present invention relates to a transistor circuit and, more particularly, to an oscillation circuit which is capable of performing a stable oscillation against a wide range of temperature change.

As shown in FIG. 1, a conventional oscillation circuit is constituted by a differential amplifier 1 which is supplied with a positive feedback signal $S_F$ and which outputs an oscillation signal $S_0$, and a feedback circuit 2 which is supplied with the oscillation signal $S_0$. The differential amplifier 1 is constituted by a pair of transistors Q1 and Q2, a load $Z_L$, a constant current source I, bias resistors R1 and R2, a bypass capacitor C3, and a bias voltage source $V_B$. The feedback circuit 2 is constituted by coupling capacitors C1 and C2, and a resonance circuit composed of a capacitor $C_0$ and an inductor $L_0$.

In the following, the operation of the conventional oscillation circuit having the above circuit construction is described. When an oscillating current is produced in the oscillation circuit, the current is resonated through the resonance circuit composed of the capacitor $C_0$ and the inductor $L_0$ with a resonance frequency f expressed as follows.

$$f = \frac{1}{2\pi \sqrt{L_0 C_0}} \quad (1)$$

The resonant current is then fed to the base of the transistor Q1 through the coupling capacitor C2, and amplified by the differential amplifier 1, so that an oscillation signal $S_0$ is outputted from the collector of the transistor Q2 and then positively fed back to the base of the transistor Q1 through the coupling capacitors C1 and C2. As a result, oscillation with the same frequency as the resonance frequency is produced. That is, the oscillation frequency of the conventional oscillation circuit shown in FIG. 1 is expressed by the above equation (1). In the case of a high-frequency oscillation circuit, however, the oscillation frequency thereof cannot be expressed by the equation (1) because it is affected by the input impedance of the differential amplifier 1. The oscillation frequency of a high-frequency oscillation circuit is explained by making reference to the expressions given hereunder.

FIG. 2 shows the feedback circuit 2 extracted from the conventional oscillation circuit of FIG. 1 on the assumption that an input impedance of the differential amplifier 1 viewed from the base of the transistor Q1 is expressed by $Z_{IN}$. In FIG. 2, the ratio $V_1/V_0$, that is, a feedback factor $\beta$, is expressed as follows.

$$\beta = \frac{\frac{1}{C_0 S + \frac{1}{L_0 S} + G + \frac{1}{Z_{IN} + 1/SC_1}}}{\frac{1}{SC_2} + \frac{1}{C_0 S + \frac{1}{L_0 S} + G + \frac{1}{Z_{IN} + 1/SC_1}}} \cdot \frac{Z_{IN}}{Z_{IN} + 1/SC_1} \quad (2)$$

$$= \frac{SC_2}{C_0 S + \frac{1}{L_0 S} + G + \frac{1}{Z_{IN} + 1/SC_1} + SC_2} \cdot \frac{SZ_{IN}C_1}{1 + SZ_{IN}C_1}$$

$$= \frac{SC_2}{C_0 S + \frac{1}{L_0 S} + G + \frac{SC_1}{1 + SZ_{IN}C_1} + SC_2} \cdot \frac{SZ_{IN}C_1}{1 + SZ_{IN}C_1}$$

$$= \frac{S^2 C_1 C_2 Z_{IN}}{\left(C_0 S + \frac{1}{L_0 S} G\right)(1 + SZ_{IN}C_1) + SC_1 + SC_2(1 + SZ_{IN}C_1)}$$

$$= \frac{S^2 C_1 C_2 Z_{IN}}{(C_0 + G \cdot Z_{IN} \cdot C_1 + C_1 + C_2)S + \frac{1}{L_0 S} + G + \frac{Z_{IN}}{L_0} C_1 + (Z_{IN}C_0C_1 + Z_{IN}C_1C_2) S^2} \quad (3)$$

In the above expressions, $S = j\omega$, and G represents the reciprocal of the resistive component r of the coil $L_0$.

When the open gain of the differential amplifier 1 is assumed to be represented by $A_0$, a condition for oscillating is expressed by the following equation (4).

$$A_0 \beta = 1 \quad (4)$$

Applying the equation (4) into the equation (3), the following equation is obtained.

$$\beta = \frac{S^2 C_1 C_2 Z_{IN}}{(C_0 + G \cdot Z_{IN} \cdot C_1 + C_1 + C_2)S + \frac{1}{L_0 S} + G + \frac{Z_{IN}}{L_0} C_1 + (Z_{IN}C_0C_1 + Z_{IN}C_1C_2) S^2} \quad (5)$$

$$= \frac{1}{A_0}$$

If the imaginary part of $\beta$ is zero, the equation (5) is established and the oscillating condition is satisfied. Here, $$(C_0 + G \cdot Z_{IN} \cdot C_1 + C_1 + C_2)S + \frac{1}{L_0 S} = 0 \quad (6)$$

Rearranging the equation (6) by substituting $S=j\omega$ thereinto, the following equation (7) is obtained.

$$\omega = \frac{1}{\sqrt{L_0(C_0 + C_1 + C_2 + G \cdot Z_{IN} \cdot C_1)}} \quad (7)$$

$$f_0 = \frac{1}{2\pi \sqrt{L_0(C_0 + C_1 + C_2 + G \cdot Z_{IN} \cdot C_1)}}$$

The oscillation frequency $f_0$ of the circuit can be calculated according to the equation (7). In the equation (7), the input impedance $Z_{IN}$ of the differential amplifier 1 may be expressed by the following equation (8) on the assumption that it is pure resistance.

$$Z_{IN} \approx h_{fe}/g_m \quad (8)$$

in which $g_m$ represents the mutual conductance of the differential amplifier 1, and $h_{fe}$ represents the current amplification factor of the transistor concerned.

Substituting the above equation (8) into the equation (7), the following equation (9) is obtained.

$$f_0 = \frac{1}{2\pi \sqrt{L_o(C_0 + C_1 + C_2 + G \cdot h_{fe} \cdot C_1/g_m)}} \quad (9)$$

Thus, as expressed by the above equation (9), the oscillation frequency $f_0$ of the conventional oscillation circuit contains the mutual conductance $g_m$ of the differential amplifier 1 expressed by the following equation (10).

$$g_m = \frac{qI}{4kT} \quad (10)$$

in which k represents a Boltzmann constant, T represents an absolute temperature, and q represents an electron charge quantity.

From the above equation (10), it is understood that the mutual conductance $g_m$ changes as the temperature changes and, therefore, the oscillation frequency $f_0$ including $g_m$ changes as the temperature changes. That is, the temperature-depending fluctuation of the oscillation frequency of the oscillation circuit is large. Here, the temperature-depending fluctuation of the oscillation frequency $f_0$ is examined by substituting certain constants into the equation (9). Assuming now that $G=0.001$, $h_{fe}=100$, $g_m=0.2$ (at the temperature $t=-25°C$.) and $C_0=C_1=C_2$ are established and I does not change as the temperature changes, the oscillation frequency $f_1$ at the temperature $t=-25°$ C. can be expressed by the equation (11).

$$f_1 = \frac{1}{2\pi \sqrt{3.5 \, C_0 \, L_0}} \quad (11)$$

The mutual conductance $g_m'$ at the temperature $t'=75°$ C. can be expressed by the following equation (12).

$$g_m' = \frac{qI}{4kT'} = \frac{qI}{4kT} \cdot \frac{T}{T'} = g_m \cdot \frac{273 + t}{273 + t'} = g_m \cdot \frac{273 - 25}{273 + 25} \quad (12)$$

Here, the value of $g_m'$ at the temperature $t'=75°$ C. can be calculated by substituting 0.2 for $g_m$ as follows:

$g_m' \approx 0.14$

Accordingly, the oscillation frequency $f_2$ at the temperature $t'=75°$ C. can be expressed as follows.

$$f_2 = \frac{1}{2\pi \sqrt{3.71 \, C_0 \, L_0}} \quad (13)$$

$$\therefore \frac{f_2}{f_1} = \frac{\frac{1}{2\pi \sqrt{3.71 \, C_0 \, L_0}}}{\frac{1}{2\pi \sqrt{3.5 \, C_0 \, L_0}}} = \sqrt{\frac{3.50}{3.71}} \approx 0.97$$

Assuming now that $f_1$ is 480 MHz, $f_2 = 0.97 \times 480 = 466$ MHz. Accordingly, in a temperature range of from $-25°$ C. to 75° C., the width of fluctuation of the oscillation frequency is 14 MHz. Thus, there has been a problem in that the temperature-depending fluctuation of the oscillation frequency is large.

SUMMARY OF THE INVENTION

It is, therefore, an object of the invention to overcome the drawbacks existing in the conventional oscillation circuits and to provide an improved oscillation circuit.

It is another object of the invention to provide an oscillation circuit for performing oscillation with a stable oscillation frequency against temperature changes.

In order to attain the above objects, according to an aspect of the present invention, there is provided an oscillation circuit which comprises:

an oscillator which has a differential amplifier including a constant current source having a resistor and a transistor whose emitter is grounded through the resistor, and a feedback circuit through which an output of the differential amplifier is positively fed back to an input of the same differential amplifier;

a band-gap regulator which includes a pair of transistors whose emitter areas are different from each other and which is for producing a band-gap voltage proportional to a thermal voltage of the pair transistors; and an operational amplifier for DC-amplifying the band-gap voltage and supplying the amplified band-gap voltage to the base of the transistor forming the constant current source.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Throughout the following explanation, similar reference symbols or numerals refer to the same or similar elements in all the figures of the drawings.

Now, embodiments of the present invention will be described below with reference to the drawings.

Figure 1:
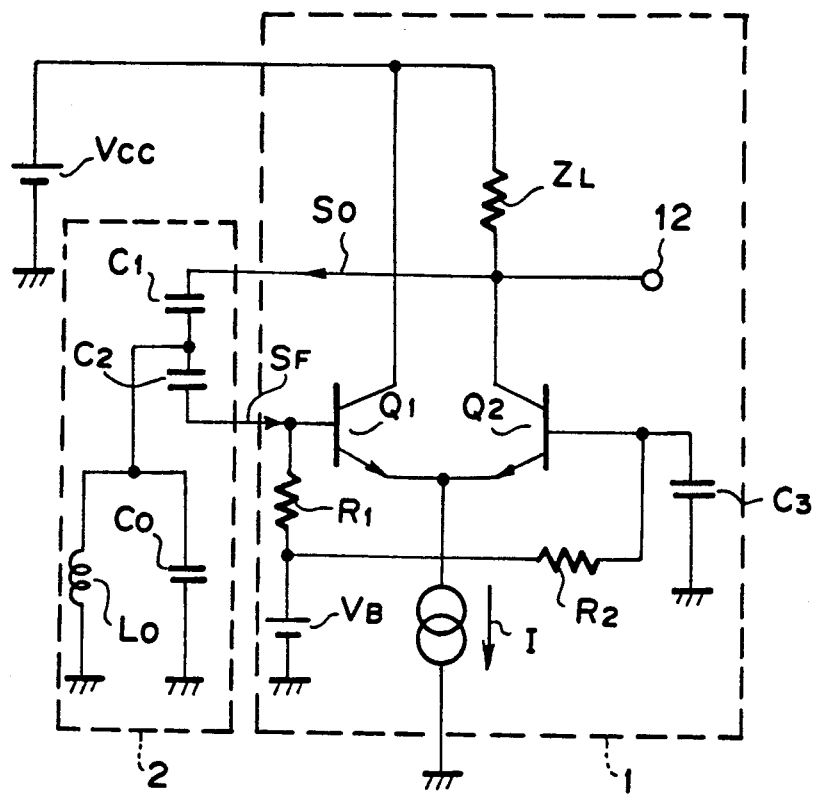
FIG. 1 is a circuit diagram showing a conventional oscillation circuit.
Figure 2:
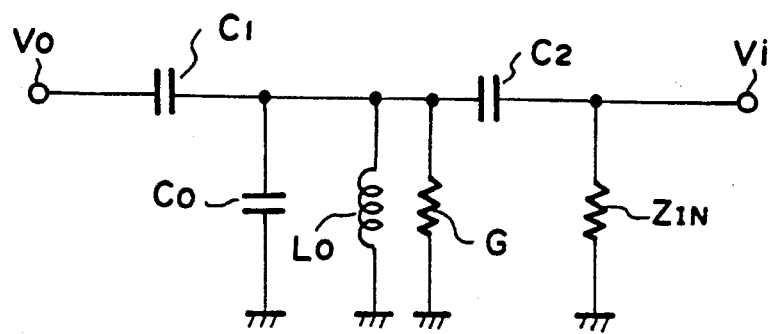
FIG. 2 is an equivalent circuit diagram of a feedback circuit used in the conventional oscillation circuit.
Figure 3:
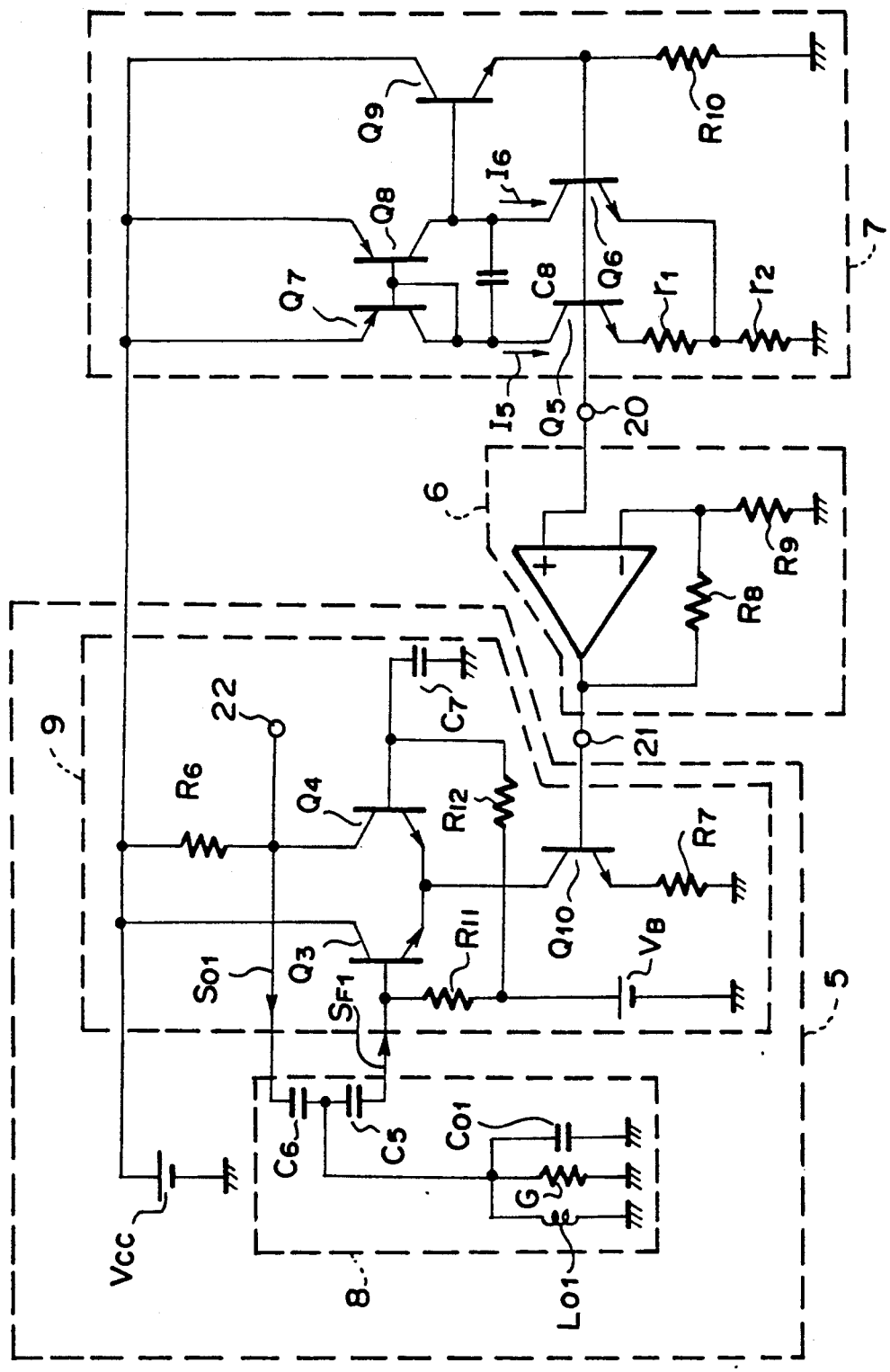
FIG. 3 is a circuit diagram showing an embodiment of the oscillation circuit according to the present invention.

FIG. 3 shows an embodiment of the oscillation circuit according to the present invention. The oscillation circuit is constituted by an oscillator 5, an operational amplifier 6, and a band-gap regulator 7.

The oscillator 5 is constituted by a differential amplifier 9, and a feedback circuit 8. The differential amplifier 9 includes a pair of transistors Q3 and Q4. A positive feedback signal $S_{F1}$ is supplied from the feedback circuit 8 to the base of the transistor Q3. The positive feedback signal is amplified by the differential amplifier, so that an oscillation signal $S_{01}$ is outputted from the collector of the transistor Q4 and positively fed back to the base of the transistor Q3 through coupling capacitors $C_6$ and $C_5$. $R_{11}$ and $R_{12}$ represent base bias-resistors for the transistors Q3 and Q4, respectively, $V_B$ represents a base bias-source, $C_7$ represents a bypass capacitor, and $R_6$ represents a load resistor. In FIG. 3, a capacitor $C_{01}$ and an inductor $L_{01}$ in the feedback circuit 8 constitute a resonance circuit. $R_{01}$ represents a resistive component of the inductor $L_{01}$. These elements together with the coupling capacitors $C_6$ and $C_5$ determine the oscillation frequency of the circuit. The band-gap regulator 7 is constitued by transistors Q5 through Q9, resistors $r_1$, $r_2$ and $R_{10}$, and a phase-compensation capacitor $C_8$. The emitter area ratio of the transistors Q5 and Q6 is set to N:1 (N>2). An output of the band-gap regulator 7, that is, a band-gap voltage, is outputted through a terminal 20. The band-gap voltage is DC-amplified by the operational amplifier 6, and then applied to the base of the transistor Q10. This transistor Q10 and a resistor R7 constitute a constant current source, and a constant current I flowing in the differential amplifier 9 is determined or controlled by the base voltage of the transistor Q10. The oscillation frequency $f_{05}$ of the oscillator 5 can be calculated according to the aforementioned equation (9). That is, the oscillation frequency $f_{05}$ is expressed by the following equation (14):

$$f_{05} = \frac{1}{2\pi L_{01}(C_{01} + C_5 + C_6 + G_{01} \cdot h_{fe5} \cdot C_5/g_{m5})} \quad (14)$$

in which $h_{fe5}$ represents the current amplification factor of the transistor concerned, and $g_{m5}$ represents the mutual conductance of the differential amplifier 9.

If the mutual conductance $g_{m5}$ in the equation (14) is constant regardless of the temperature change, the oscillation frequency $f_{05}$ expressed by the equation (14) is also constant against the temperature change. The band-gap voltage $V_{BG}$ of the band-gap regulator 7 is calculated as follows. Let $I_5$ and $I_6$ be the collector currents of the transistors Q5 and Q6, respectively. Current mirror circuit constituted by the transistors Q7 and Q8 and the feedback circuit constituted by the transistor Q9 and the resistor R10 make the collector currents $I_5$ and $I_6$ substantially equal to each other as shown in the following equation (15).

$$I_5 = I_6 = I \quad (15)$$

The base-emitter voltages of the transistors Q5 and Q6 are determined by the emitter area ratio (N) as represented by the following equations.

$$V_{BE(Q6)} = V_{BE(Q5)} + r_1 I \quad (16)$$

$$v_T \ln \frac{I_6}{I_S} = v_T \ln \frac{I_5}{NI_S} + r_1 I \quad (17)$$

in which $V_T$ represents the thermal voltage of the respective transistors Q5 and Q6.

Rearranging the equation (17) by substituting the equation (15) into the equation (17), the following equation (18) is obtained.

$$V_T \ln N = r_1 I \quad (18)$$

Because the current flowing in the resistor $r_2$ is 2I, the emitter voltage $V_{E(Q6)}$ of the transistor Q6 is expressed by the following equation (19) based on the equation (18).

$$V_{E(Q6)} = 2Ir_2 = 2v_T \ln N \frac{r_2}{r_1} \quad (19)$$

Accordingly, the band-gap voltage $V_{BG}$ is expressed by the following equation (20).

$$V_{BG} = V_{BE(Q6)} + 2v_T \ln N \frac{r_2}{r_1} \quad (20)$$

The band-gap voltage $V_{BG}$ is amplified by the operational amplifier 6. As a result, an output voltage $V_E$ expressed by the following equation (21) is obtained from the operational amplifier 6 through a terminal 21.

$$V_E = \left(1 + \frac{R_8}{R_9}\right)V_{BG} = \left(1 + \frac{R_8}{R_9}\right)\left(V_{BE(Q6)} + 2v_T \ln N \frac{r_2}{r_1}\right) \quad (21)$$

Because the output voltage $V_E$ is used as the base voltage of the transistor Q10, the collector current $I_{C(Q10)}$ of the transistor Q10 is expressed by the following equation (22).

$$I_{C(Q10)} = \frac{V_E - V_{BE(Q10)}}{R_7}$$

$$= \frac{\left(1 + \frac{R_8}{R_9}\right)\left(V_{BE(Q6)} + 2v_T \ln N \frac{r_2}{r_1}\right) - V_{BE(Q10)}}{R_7} \quad (22)$$

Assuming now that the values of an input resistor $R_8$ and a feedback resistor $R_9$ of the operational amplifier 6 are selected to satisfy the following equation (23), the above equation (22) is rearranged to the following equation (24).

$$\left(1 + \frac{R_8}{R_9}\right)V_{BE(Q6)} = V_{BE(Q10)} \quad (23)$$

-continued $$I_{C(Q10)} = \frac{2\left(1 + \frac{R_8}{R_9}\right)v_T \ln N \frac{r_2}{r_1}}{R_7} \quad (24)$$

To simplify the equation (24), $k_1$ is used for the equation (25).

$$I_{C(Q10)} = k_1 V_r \quad (25)$$

here, $k_1$ represents $$\frac{2\left(1 + \frac{R_8}{R_9}\right)\ln N \frac{r_2}{r_1}}{R_7}$$

Because $I_{C(Q10)}$ is a constant current of the differential amplifier 9, the mutual conductance $g_{m5}$ is expressed as in the equation (26).

$$g_{m5} = \frac{I_{C(Q10)}}{4v_T} \quad (26)$$

Substituting the equation (25) into the equation (26), the following equation (27) is obtained.

$$g_{m5} = \frac{k_1}{4} \quad (27)$$

Substituting the equation (27) into the aforementioned equation (14), the following equation (28) which expresses the oscillation frequency $f_{05}$ of the circuit is obtained.

$$f_{05} = \frac{1}{2\pi \sqrt{L_{01}(C_{01} + C_5 + C_6 + G_{01} \cdot h_{fe5} \cdot C_5 \cdot 4/k_1)}} \quad (28)$$

In short, the oscillation frequency $f_{05}$ expressed in this equation (28) is constant regardless of the temperature change because it does not contain the term of temperature T.

Figure 4:
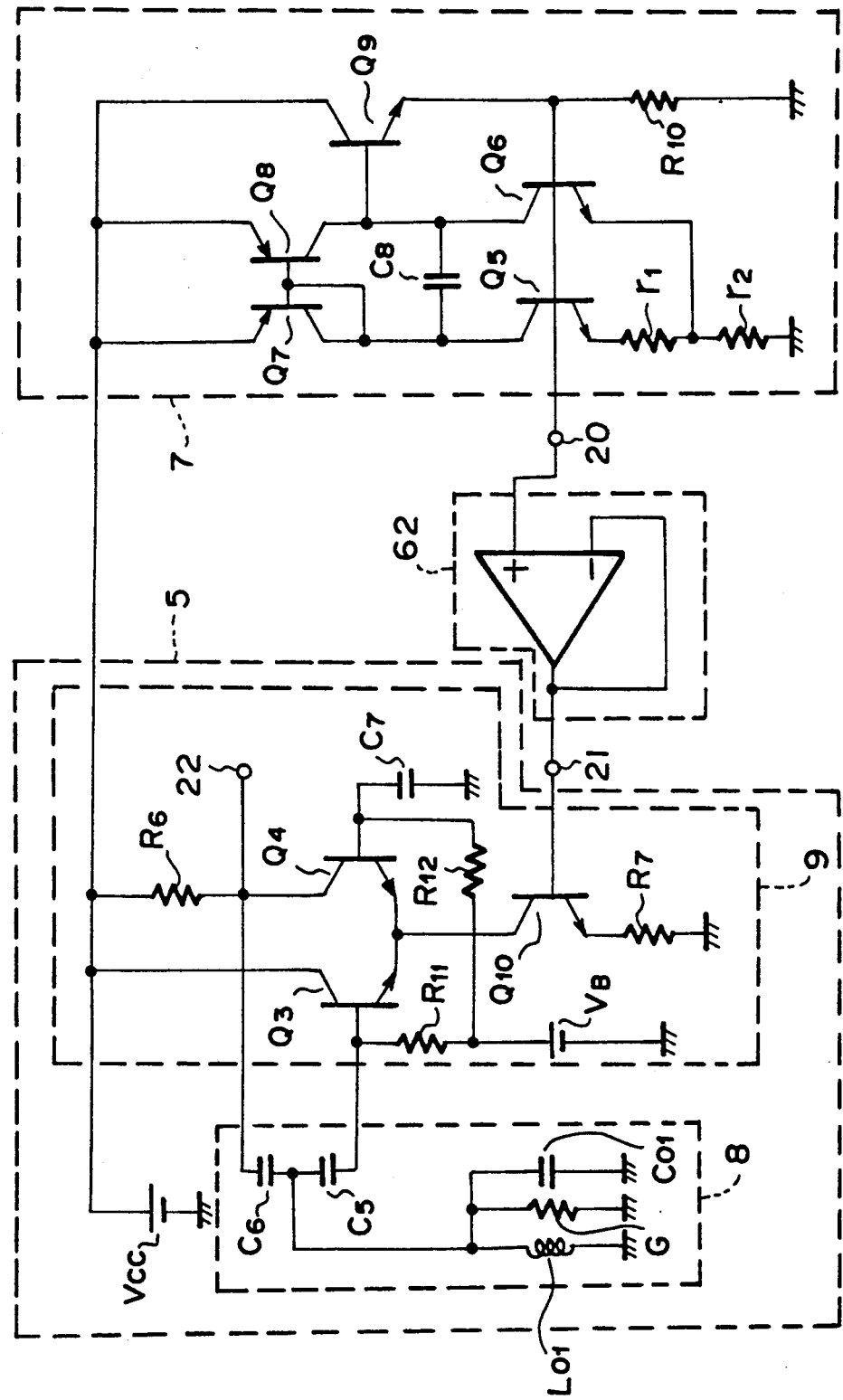
FIG. 4 is a circuit diagram showing another embodiment of the oscillation circuit according to the present invention.

FIG. 4 shows another embodiment of the oscillation circuit according to the present invention. The only difference between this embodiment and the previous embodiment shown in FIG. 3 resides in that an operational amplifier 62 in this embodiment functions as a voltage-follower while the operational amplifier 6 in the previous embodiment functions as a non-inverting amplifier having a voltage gain of (R8+R9)/R9. The remaining circuit construction other than this operational amplifier 62 is the same as that of the first embodiment and, therefore, the aforementioned description of the operation can be applied to this embodiment, and the description is omitted here.

Figure 5:
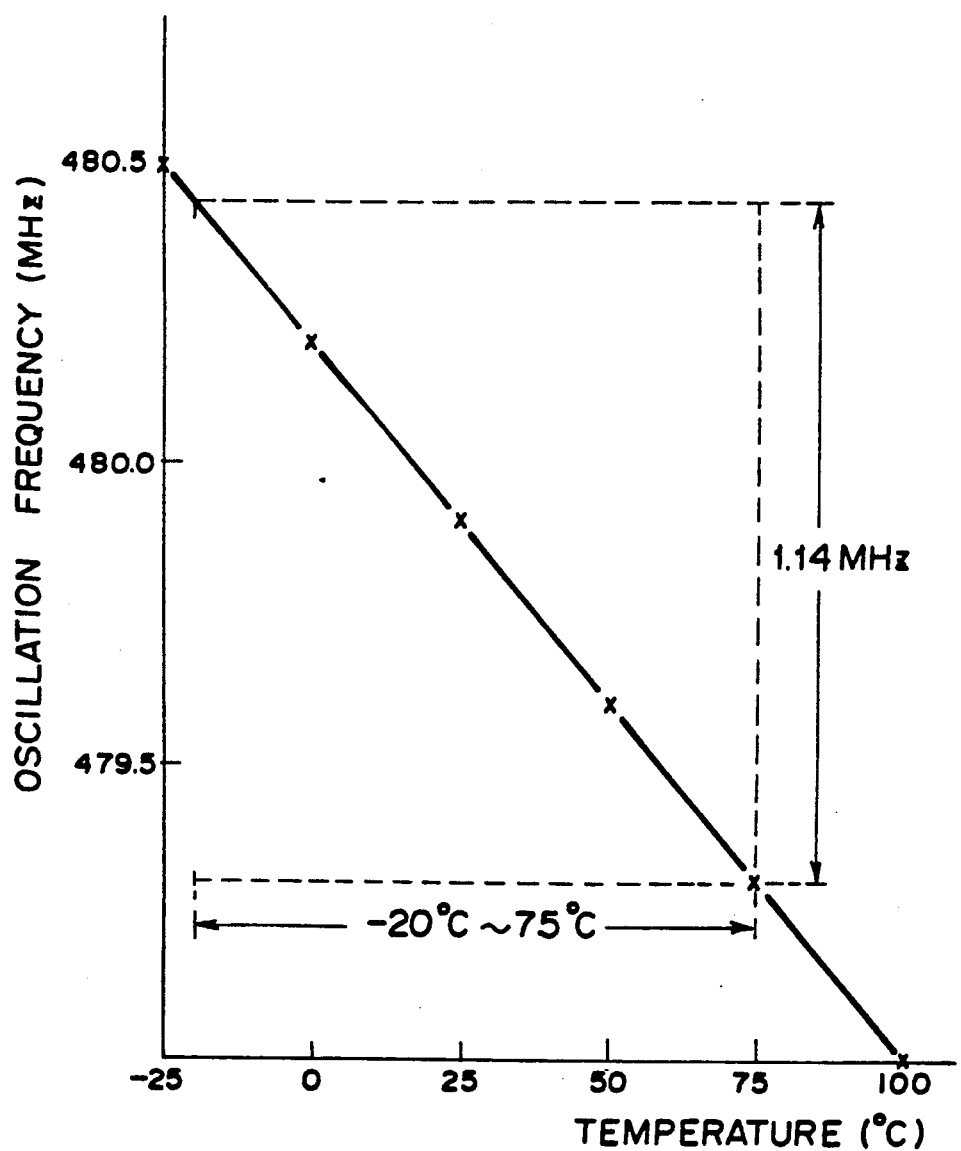
FIG. 5 is a graph showing the relation of the oscillation frequency versus temperature in the oscillation circuit experimentally obtained according to the invention.

As described above, the current of the constant current source of the differential amplifier constituting a part of the oscillation circuit according to the present invention is set so as to be proportional to the thermal voltage of the transistor. Accordingly, any parameter relating to the temperature which has an influence on the oscillation frequency can be eliminated as shown in the equation (28). The invention therefore shows an effect in that the oscillation frequency is very stable against the temperature change. The characteristic of oscillation frequency versus temperature in the oscillation circuit experimentally obtained according to the present invention is shown in FIG. 5. It is apparent from FIG. 5 that in the case where the oscillation frequency at ordinary temperature is 480 MHz, the width of fluctuation of the oscillation frequency against the temperature change in a range of from −25° C. to 75° C. can be effectively reduced to 1.14 MHz.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. An oscillation circuit comprising:
   an oscillator which has a differential amplifier including a constant current source having a resistor and a transistor whose emitter is grounded through said resistor, and a feedback circuit through which an output of said differential amplifier is positively fed back to an input of the same differential amplifier;
   a band-gap regulator which includes a pair of first and second transistors whose emitter areas are different from each other and which is for producing a band-gap voltage proportional to a thermal voltage of said pair of transistors; and
   an operational amplifier for DC-amplifying said band-gap voltage and supplying the amplified band-gap voltage to the base of said transistor forming said constant current source.

2. An oscillation circuit according to claim 1, in which said operational amplifier is a non-inverting amplifier which has an input resistor connected between an inverting input terminal and a ground terminal, and a feedback resistor connected between an output terminal and said inverting input terminal.

3. An oscillation circuit according to claim 2, in which said operational amplifier is a voltage-follower circuit with an output terminal being directly connected to an inverting input terminal.

4. An oscillation circuit according to claim 1, in which said band-gap regulator includes a current mirror circuit having a third and a fourth transistor, a feedback circuit having a fifth transistor and a resistor, an output of said current mirror circuit being fed back to the respective bases of said first and second transistors.

5. An oscillation circuit according to claim 1, in which an emitter area ratio between said first and second transistors in said band-gap regulator is N:1 (N being a number greater than two).

* * * * *

UNITED STATES PATENT AND TRADEMARK OFFICE
CERTIFICATE OF CORRECTION

PATENT NO.　：　5,151,667
DATED　　　：　September 29, 1992
INVENTOR(S)：　Kazunori NISHIJIMA It is certified that error appears in the above-identified patent and that said Letters Patent is hereby corrected as shown below:

Col. 3, line 65, delete "+25" and insert --+75--.

Col. 7, line 1'0, delete "$V_r$" and insert --$V_T$--.

Signed and Sealed this

Fourteenth Day of June, 1994

Attest:

BRUCE LEHMAN

Attesting Officer　　Commissioner of Patents and Trademarks